United States Patent
Hawes et al.

[11] Patent Number: 6,062,903
[45] Date of Patent: May 16, 2000

[54] HIGH POWER SURFACE MOUNT INTERCONNECT APPARATUS FOR ELECTRICAL POWER CONTROL MODULE

[75] Inventors: Kevin Joseph Hawes, Greentown, Ind.; Sean Michael Kelly, Williamsville, N.Y.; David Jay Vess, Kokomo, Ind.

[73] Assignee: Delco Electronics Corporation, Kokomo, Ind.

[21] Appl. No.: 09/092,994

[22] Filed: Jun. 8, 1998

[51] Int. Cl.[7] .................................................. H01R 31/08
[52] U.S. Cl. ............................ 439/507; 439/78; 174/261
[58] Field of Search ....................... 439/78, 507; 174/261

[56] References Cited

U.S. PATENT DOCUMENTS

| | | | |
|---|---|---|---|
| 3,437,740 | 4/1969 | Rosenberg et al. | 174/261 |
| 3,729,816 | 5/1973 | Burns | 29/593 |
| 3,762,040 | 10/1973 | Burns et al. | 174/261 |
| 4,603,927 | 8/1986 | Gardner | 339/17 |
| 4,834,673 | 5/1989 | Beinhaur et al. | 439/422 |
| 4,869,673 | 9/1989 | Kreinberg et al. | 439/64 |
| 4,907,991 | 3/1990 | Kobayashi | 439/507 |
| 5,040,097 | 8/1991 | Stribel | 361/395 |
| 5,266,833 | 11/1993 | Capps | 257/690 |
| 5,357,051 | 10/1994 | Hwang | 174/261 |
| 5,449,265 | 9/1995 | Legrady et al. | 414/412 |
| 5,530,625 | 6/1996 | VanDerStuyf et al. | 361/794 |
| 5,581,130 | 12/1996 | Boucheron | 307/10.1 |
| 5,605,430 | 2/1997 | Legrady | 414/412 |
| 5,632,629 | 5/1997 | Legrady | 439/78 |
| 5,655,927 | 8/1997 | Maue et al. | 439/510 |

OTHER PUBLICATIONS

Parks, T., Bus Bars For PCB Applications Keyed to Design, Performance; Electronics, Jun., 1984, pp. 23–26.

Stredde, G., Printed Circuit Board Bus Bars, The Western Electric Engineer, Jan., 1979, pp. 19–23.

*Primary Examiner*—Renee S. Luebke
*Assistant Examiner*—T. C. Patel
*Attorney, Agent, or Firm*—Jimmy L. Funke

[57] ABSTRACT

An improved interconnect apparatus for high power circuits that is low in cost and amenable for integration with low power circuits in a single electronic package. The interconnect apparatus includes serially connected surface mount bus bars bridging two or more metal pads or traces formed on a standard circuit board of the type used to package low power circuitry. The surface mount bus bars operate not only to conduct the higher currents, but also to draw heat out of the metal pads or intervening portions of the metal traces. This keeps the temperature within the capabilities of low power circuit board technology, and allows very narrow high power interconnects for reduced package size. Manufacturing cost advantages are achieved because the surface mount bus bars are assembled by automated pick-and-place equipment of the same type used for other surface mount components used in the package. In certain circumstances, a series of surface mount bus bars may be placed atop a continuous metal trace, or overlapped to provide a minimum resistance connection.

10 Claims, 3 Drawing Sheets

HIGH POWER SURFACE MOUNT INTERCONNECT APPARATUS FOR ELECTRICAL POWER CONTROL MODULE

FIELD OF THE INVENTION

This invention relates to high power electrical interconnections in a power control module, and more particularly to an electrical interconnect apparatus involving a novel utilization of surface mount bus bars.

BACKGROUND OF THE INVENTION

In complex electronic systems, it has been customary to package the high power handling circuits and devices separate from the low power handling circuits wherever possible to do so. In this way, the individual package sizes are reduced, and heat generated by the high power devices is dissipated remote from the low power circuits. However, there is a growing trend toward integration of high power and low power circuits in a single package in order to reduce the number of electrical connectors and the assembly cost of the overall system.

Prior attempts to integrate the high and low power circuits into a single package have resulted undesirably large package sizes and and/or costly implementations because traditional packaging approaches for high and low power circuits differ significantly, and cost effective electronic substrates for suitable both high and low power applications are not available.

SUMMARY OF THE PRESENT INVENTION

The present invention is directed to an improved interconnect apparatus for high power circuits that is low in cost and amenable for integration with low power circuits in a single electronic package. The invention involves a novel application of serially connected surface mount bus bars bridging two or more metal pads or traces formed on a standard circuit board of the type used to package low power circuitry. The surface mount bus bars operate not only to conduct the higher currents, but also to draw heat out of the metal pads or intervening portions of the metal traces. This keeps the temperature within the capabilities of low power circuit board technology, and allows very narrow high power interconnects for reduced package size. Manufacturing cost advantages are achieved because the surface mount bus bars are assembled by automated pick-and-place equipment of the same type used for other surface mount components used in the package. Additionally, the cost of re-routing the high power interconnects due to a design change is minimal, compared to alternative interconnect approaches such as complex metal stampings.

In general, the invention involves using a series of surface mount bus bars end-to-end to bridge two or more metal pads. However, in certain circumstances, it is also desirable to place a series of surface mount bus bars atop a continuous metal trace, or even to overlap adjacent bus bars in the series.

BRIEF DESCRIPTION OF THE DRAWINGS

FIG. 3A is a cross-sectional view, and FIG. 3B is a top view.

FIG. 7A is a cross-sectional view, and FIG. 7B is a top view.

DETAILED DESCRIPTION OF THE DRAWINGS

The high power surface mount interconnect apparatus of this invention is illustrated in the environment of an electronic module having both high and low power circuits integrated in a single package on a single low power circuit board. However, it will be understood that this invention is directed to a high power interconnect per se, and is not limited to such an integrated module. In other words, the present invention may equally be utilized in a module containing only high power circuits, if so desired.

Figure 1:
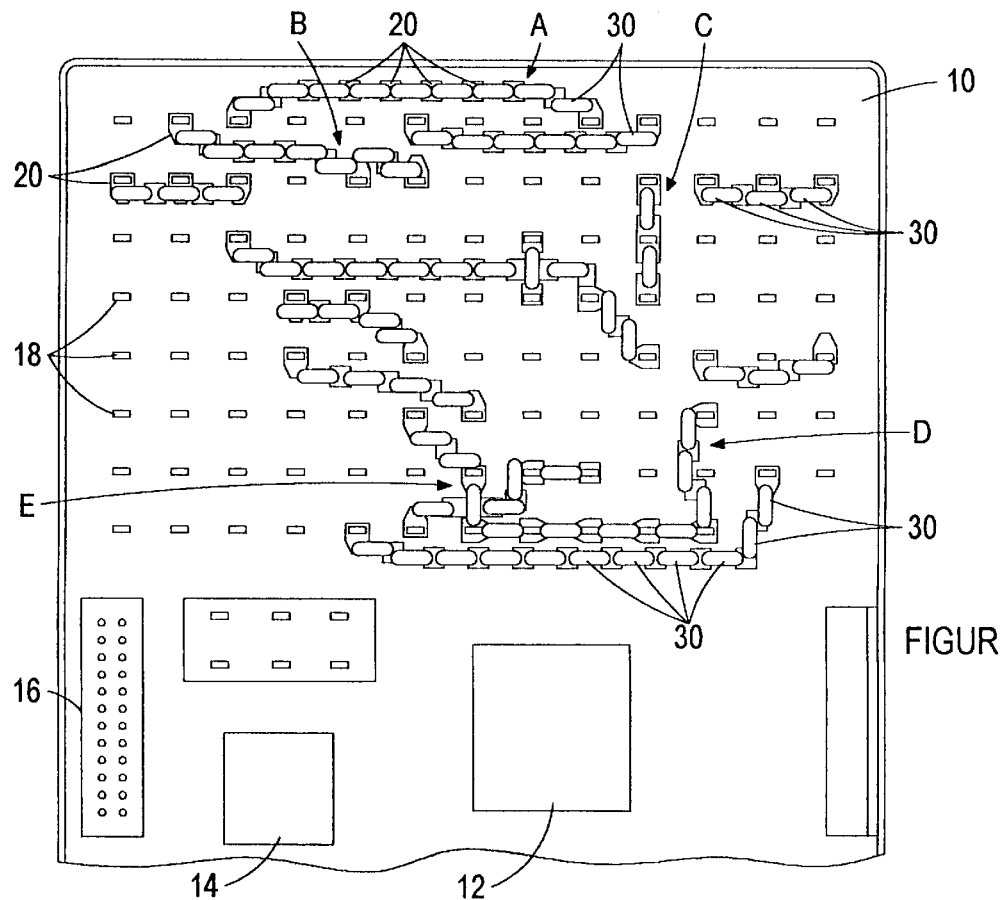
FIG. 1 is a partial top view of a circuit board having high and low power circuits, and utilizing surface mount bus bars as a high power interconnect in accordance with this invention.

Referring to the drawings, FIG. 1 depicts a portion of a conventional circuit board 10 suitable for use with low power circuitry such as microprocessor 12, and various surface mount electronic components, generally designated by the reference numeral 14. One or more connectors 16 mounted near marginal areas of the board 10 provide access to the low power circuits 12, 14 via conventional printed circuit traces, not shown. High power devices such as relays and fuses (not shown) are mounted on the reverse side of the circuit board 10, and are coupled to metal connector pins 18 which protrude through several rows of plated holes formed in the board 10. Connectors (not shown) attached to the exposed metal pins 18 provide access to the high power devices. For isolation and ease of connection, the low power circuits 12, 14 and connectors 16 can be grouped on one end of the board 10 (the lower end, as viewed in FIG. 1), and the high power devices grouped on the opposite end of the board 10, as shown.

To avoid connector complexity and cost, it is desirable to establish electrical connections among the various connector pins 18 at the circuit board level. For example, the vehicle ignition or battery voltages may need to be present at several different pins, depending on the fuse orientation and relay pin layout. If high current capability metal plated circuit boards are not economically feasible for a given application, conventional approaches for forming the high current interconnects among the connector pins 18 would be to provide a separate complex metal stamping that is bonded or soldered to the pins 18, or to form thick, wide metal traces in spaces between the pins. By way of example, a standard 1-oz. thick copper trace (0.0014 inch nominal thickness) designed to handle a 20 A load current at customary vehicle battery voltages of 8–18 V would require a trace width of approximately 0.40 inch to maintain reasonable operating temperatures. Increasing the thickness of the trace to 2-oz. copper (double plating weight) results in a reduced trace width of 0.20 inch, but the increased copper thickness may not be economically feasible, and tends to limit the ability to produce fine pitch traces for high-density low-power components elsewhere on the circuit board. In addition, wide traces preclude small connector centerlines, and tend to increase the size of the electronic package. Clearly, the conventional approaches do not provide an attractive solution for providing high power and low power circuits on the same electronic substrate.

Figure 2:
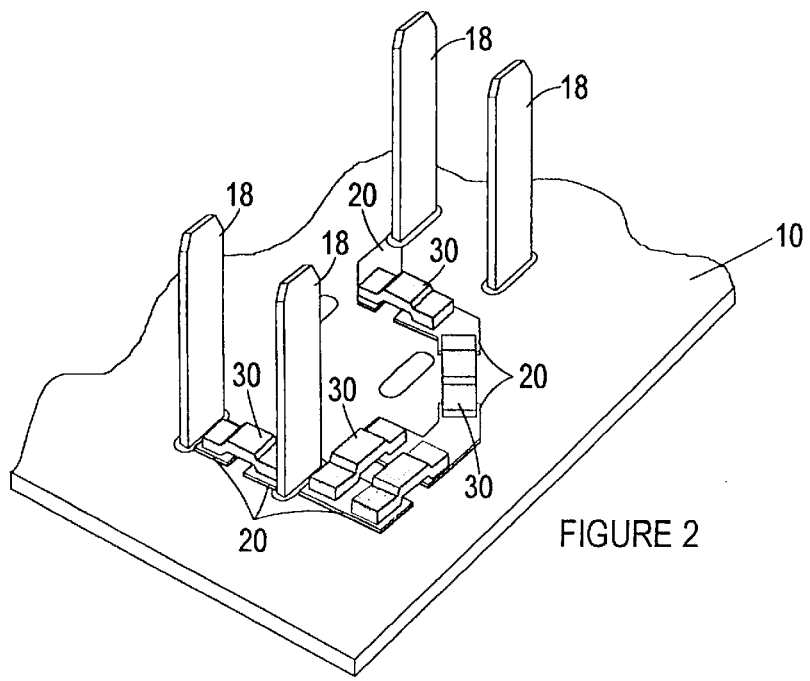
FIG. 2 is an isometric view of a portion of the circuit board of FIG. 1.
Figure 3A:
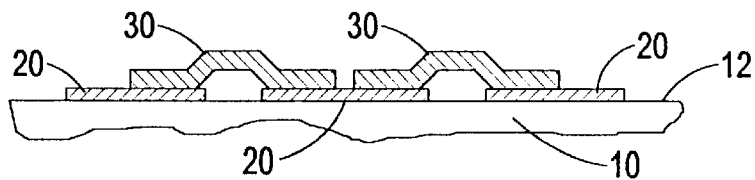
FIGS. 3A–3B depict an interconnect apparatus according to a first embodiment of this invention.
Figure 3B:
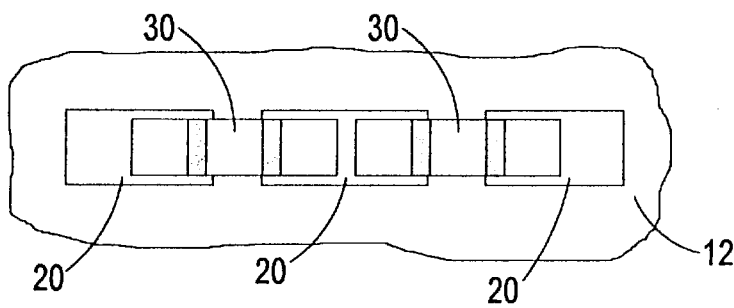
Figure 6:
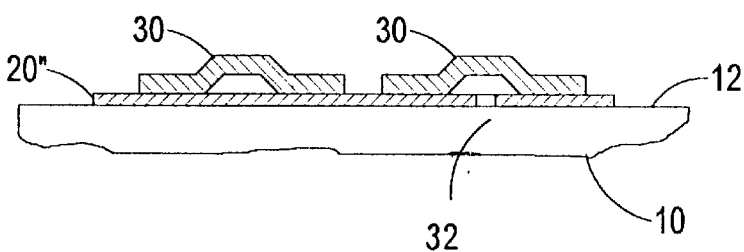
FIG. 6 is a cross-sectional view corresponding to FIG. 3A, but depicting a semi-continuous conductor pad according to a second embodiment of this invention.
Figure 7A:
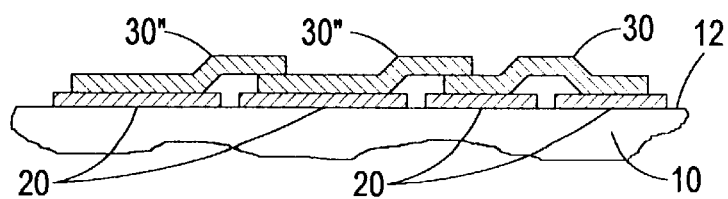
FIGS. 7A–7B depict an interconnect apparatus according to a third embodiment of this invention.
Figure 7B:
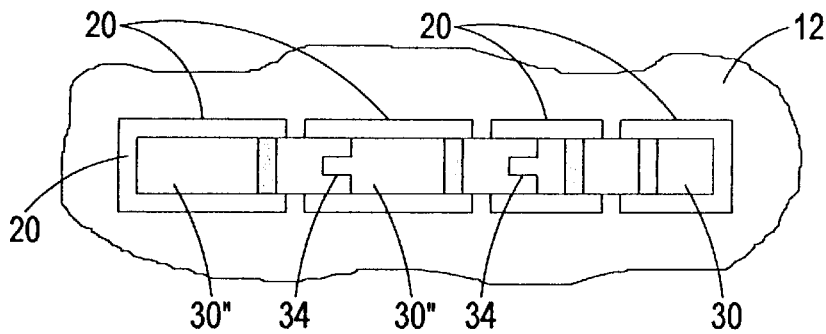

The above described limitations are overcome according to the present invention, by a novel application of surface mount bus bars 30. Surface mount bus bars, sometimes referred to herein simply as bus bars, are commercially available from Zierick Manufacturing Corporation, for example. These devices are designed for creating an electrical bridge from one circuit to another over an intervening conductor trace, and are typically employed as jumpers in a single sided circuit board assembly as an aid in trace routing. Thus, they are characteristically shaped in the form of a bridge, as best seen in FIGS. 2, 3A and 6. However, we have discovered that surface mount bus bars may be utilized in combination with strategically disposed conductor pads to form high power electrical interconnects on a conventional circuit board designed for low power circuitry. An example of the invention is illustrated in FIGS. 1–2, where selected connector pins 18 are electrically interconnected by forming conductive pads 20 on the exposed face of the circuit board 10, and inter-linking the pads with one or more surface mount bus bars 30. Certain conductor pads, which may be referred to as connector pads, are formed at the site of selected connector pins 18 and are electrically coupled to the respective pin and through-hole metal. Other conductor pads, which may be referred to as trace pads, are formed at various locations between rows of connector pins 18. Preferably, a single size of surface mount bus bar is used, and the pads 20 are placed accordingly.

Instead of the 0.40 inch wide 1-oz. traces that would be required to provide 20 A current handling capability with conventional high power interconnect techniques, the surface mount bus bar interconnect link of this invention requires a width of only 0.087 inch, with 1-oz copper conductor pads. Even higher current handling capability can be achieved by placing two (or more) bus bars in parallel as illustrated in FIG. 2, while still retaining the trace width advantage. The bus bars not only form a high power bridge between adjacent conductor pads, but also act as a heat sink, drawing heat out of the conductor pads 20 and thereby further increasing the current handling capability of the link.

Further cost savings are realized during board manufacture and assembly, as the bus bars 30 may be automatically placed by the same "pick-and-place" equipment used to position other surface mount devices such as the parts 12 and 14. Moreover, conventional reflow or wave soldering techniques may be used to solder the surface mount bus bars 30 to their respective pads 20. If a design change forces re-location of the interconnects, the conductor trace pattern is revised, and the pick-and-place machinery is re-programmed to place the bus bars in different locations.

As illustrated in FIG. 1, the layout of pads 20 and surface mount bus bars 30 is very flexible, and can be configured to suit the particular requirements of any circuit. In certain cases, as generally designated by the letter A, two pins in the same row can be connected by a string of surface mount bus bars 30 disposed in an area between rows or in a marginal area of circuit board 10. Similarly, the letter B generally designates a case in which a string of surface mount bus bars 30 interconnect two pins 18 in adjacent rows. The letter C generally designates a case in which a single surface mount bus bar 30 can be used to bridge two adjacent connector pads 20. The letter D generally designates a case in which connector pins in non-adjacent rows are interconnected by surface mount bus bars 30 oriented perpendicular to the rows. Finally, the letter E generally designates a case in which two high power interconnection links intersect, with a surface mount bus bar of one link bridging a conductor pad of the other link. Other configurations, such as perpendicularly oriented bus bars soldered to a single conductor pad, or the angled conductor pads of FIG. 2, are also possible.

Figure 4:
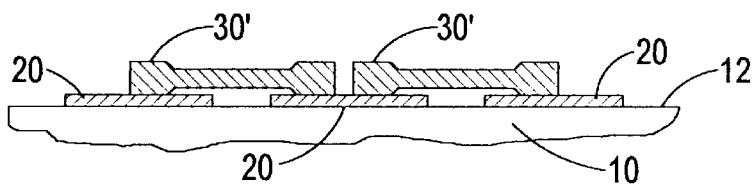
FIG. 4 is a cross-sectional view corresponding to FIG. 3A, but depicting an alternate bus bar configuration.
Figure 5:
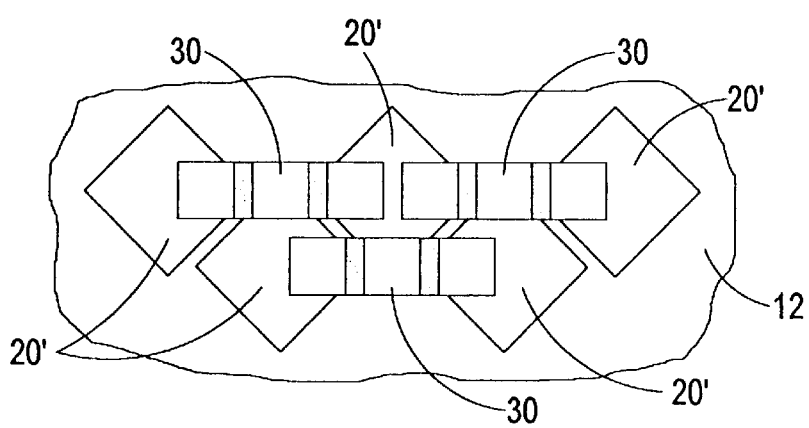
FIG. 5 is a top view of a variation of the first embodiment of this invention.

FIGS. 3–7 generally depict various embodiments of the present invention. FIGS. 3A and 3B depict cross-section and top views of a first embodiment in which a series of bus bars 30 successively interconnect several spaced apart conductor pads 20, substantially as shown in FIGS. 1–2. FIG. 4 depicts an alternate bus bar configuration 30' that is longitudinally as well as laterally symmetrical; this configuration is especially advantageous in that the pick-and-place machinery has the freedom to orient the bars 30' either "right-side-up" or "up-side-down". FIG. 5 depicts a variation of the first embodiment in which the pads 20' are diamond-shaped, or have lateral extensions that in some cases extend under the raised center area of a bus bar 30 of an adjacent connection link; this configuration allows significantly increased conductor pad area without increasing the spacing between adjacent connection links. The increased conductor pad area reduces the resistance of the interconnect link, and more significantly, increases heat dissipation. FIG. 6 depicts a second embodiment in which the bus bars 30 are serially disposed on a continuous or semi-continuous conductor trace 20" to provide increased heat dissipation. While a continuous trace 20" may be used, the semi-continuous trace depicted in FIG. 6 (note space 32 under the right-most bus bar 30) provides substantially the same heat dissipation performance while enabling electrical continuity testing between end points of the connection link for diagnostic purposes. Finally, FIGS. 7A–7B depict a third embodiment in which a series of bus bars 30, 30" are partially overlapped; FIG. 7A depicts a cross-sectional sectional view, while FIG. 7B depicts a top view. The third embodiment provides a significant performance improvement, both in interconnect link resistance and heat dissipation, as there is a continuous chain of bus bars in the link. To facilitate soldering of the raised ends of bus bars 30", such ends may be notched as designated by the reference numeral 34 to accept an inserted solder pre-form or to define a region which is filled with solder paste prior to re-flow.

Figure 8:
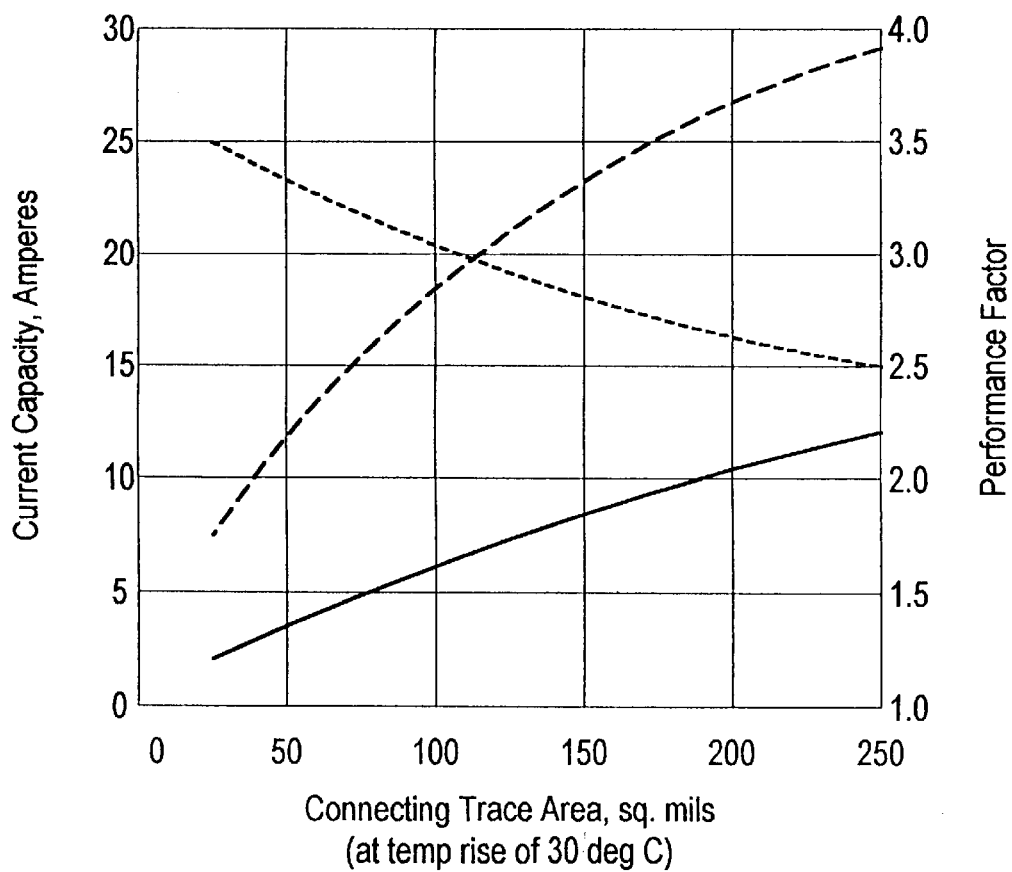
FIG. 8 is a graph comparing the performance of the interconnect configuration of FIG. 6 to that of a bare copper trace.

FIG. 8 graphically compares the performance of the configuration of FIG. 6 (broken line) with that of a bare copper trace with no bus bars (solid line). The graph depicts current capacity in amperes as a function of conductor pad cross-sectional area (which corresponds in practice to the width of the interconnect link) for a given temperature rise of 30 degrees C. As seen in the graph, the bus bar configuration significantly outperforms the bare trace. A performance improvement factor PF, defined as a ratio of current capacities, normalized to the bare copper trace of abscissa width, is depicted by the dotted line, with the scale shown on the right-hand vertical axis. As indicated, a performance increase of 2.5–3.5 is achieved with the bus bar interconnect, depending on physical dimensions and material.

Each of the embodiments described above can be used to form high power electrical interconnects on a standard low power (i.e., 1 oz.) circuit board in a cost effective and space efficient manner. Additional advantages are realized in applications such as depicted in FIG. 1 where both high and low power circuits are combined on a single circuit board since the high power interconnect strategy does not adversely impact the low power side of the board. Although described in reference to the illustrated embodiments, it is expected that various modifications will occur to those skilled in the art. For example, the alternate bus bar configuration 30' can be used with a continuous or semi-continuous conductor pad 20", and so on. Accordingly, it will be understood that the scope of this invention is not limited to the illustrated embodiments and that interconnect devices incorporating these and other modifications may fall within the scope of this invention, which is defined by the appended claims.

The embodiments of the invention in which an exclusive property or privilege is claimed are defined as follows:

1. A high power electrical circuit, comprising:
   a circuit board;
   a plurality of connector pins extending out of said circuit board, including first and second connector pins;
   first and second conductive connector pads formed on said circuit board in contact with said first and second connector pins, respectively;
   a conductive trace pad formed on said circuit board intermediate said first and second connector pads, said trace pad being electrically isolated from said first and second connector pads, and
   first and second arched bus bar segments connected in series to electrically interconnect said first and second connector pads, the first bus bar segment electrically interconnecting said first connector pad to said trace pad, and
   said second bus bar segment electrically interconnecting said trace pad to said second connector pad.

2. The high power electrical circuit of claim 1, wherein said bus bars have electrical contact areas at opposite ends thereof and a central portion intermediate said contact areas that is spaced from said circuit board, the high power electric circuit further comprising:
   third and fourth connector pads on said circuit board, a portion of said third and fourth connector pads extending between the circuit board and the central portions of said first and second bus bars; and
   a third bus bar electrically interconnecting said third and fourth connector pads, a portion of said trace pad extending between said circuit board and a central portion of said third bus bar.

3. The high power electrical circuit of claim 1, wherein the bus bars are symmetrical about longitudinal and lateral axes.

4. The high power electrical circuit of claim 1, wherein said trace pad is spaced apart from said first and second connector pads.

5. The high power electrical circuit of claim 1, wherein said bus bars have electrical contact areas at opposite ends thereof and the contact area of said first bus bar is disposed on the contact area of said second bus bar.

6. The high power electrical circuit of claim 5, wherein the contact area of said first bus bar is notched to provide a solder pre-form to facilitate soldering of said first bus bar to said second bus bar.

7. A high power electrical circuit, comprising:
   a circuit board;
   a plurality of connector pins extending out of said circuit board, including first and second connector pins;
   first and second conductive connector pads formed on said circuit board in contact with said first and second connector pins respectively;
   a series of conductive trace pads formed in a string on said circuit board intermediate said first and second connector pads each of said trace pads being electrically isolated from said first and second conector pads;
   a first arched surface mount bus bar electrically bridging said first connector pad to a first trace pad in said series of trace pads;
   a series of arched surface mount bus bars disposed substantially end-to-end electrically bridging adjacent trace pads in said series of trace pads; and
   a last arched surface mount bus bar electrically bridging said second connector pad to a last trace pad in said series of trace pads, thereby forming an electrical interconnect between said first and second connector pad.

8. The high power electrical circuit of claim 7, wherein said series of trace pads are continuous with each other.

9. The high power electrical circuit of claim 7, wherein the bus bars are symmetrical about longitudinal and lateral axes.

10. The high power electrical circuit of claim 7, wherein said bus bars have electrical contact areas at opposite ends thereof, the contact area of one of the bus bars is disposed on the contact area of another of said bus bars, and the contact area of said one bus bar is notched to provide a solder pre-form to facilitate soldering of said one and another bus bars.

* * * * *